(12) United States Patent
Moriya et al.

(10) Patent No.: US 7,654,010 B2
(45) Date of Patent: Feb. 2, 2010

(54) SUBSTRATE PROCESSING SYSTEM, SUBSTRATE PROCESSING METHOD, AND STORAGE MEDIUM

(75) Inventors: Tsuyoshi Moriya, Nirasaki (JP); Kazuya Nagaseki, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 168 days.

(21) Appl. No.: 11/671,821

(22) Filed: Feb. 6, 2007

(65) Prior Publication Data
US 2007/0193062 A1    Aug. 23, 2007

Related U.S. Application Data

(60) Provisional application No. 60/783,850, filed on Mar. 21, 2006.

(30) Foreign Application Priority Data
Feb. 23, 2006    (JP)    ............................. 2006-046696

(51) Int. Cl.
*F26B 3/00*    (2006.01)
(52) U.S. Cl. ................. 34/449; 34/499; 34/78; 34/80; 34/90; 34/210; 118/65; 118/715
(58) Field of Classification Search .................. 34/449, 34/499, 78, 80, 90, 210; 118/65, 715
See application file for complete search history.

(56) References Cited

U.S. PATENT DOCUMENTS

| | | | | |
|---|---|---|---|---|
| 3,683,848 A | * | 8/1972 | Plumat et al. | 118/719 |
| 3,857,682 A | * | 12/1974 | White | 428/610 |
| 4,221,956 A | * | 9/1980 | Fielding et al. | 219/388 |
| 4,339,508 A | * | 7/1982 | Tsuya et al. | 428/606 |
| 4,424,176 A | * | 1/1984 | Shirley et al. | 264/7 |
| 4,721,556 A | * | 1/1988 | Hsu | 204/258 |
| 4,728,353 A | * | 3/1988 | Thomas et al. | 65/60.1 |
| 4,817,652 A | * | 4/1989 | Liu et al. | 134/102.1 |
| 4,836,858 A | * | 6/1989 | Reinhart | 134/1 |
| 4,878,934 A | * | 11/1989 | Thomas et al. | 65/60.52 |
| 4,917,717 A | * | 4/1990 | Thomas et al. | 65/60.1 |
| 4,962,776 A | * | 10/1990 | Liu et al. | 134/11 |
| 4,967,686 A | * | 11/1990 | Mottet et al. | 118/300 |
| 5,025,597 A | * | 6/1991 | Tada et al. | 451/75 |
| RE34,213 E | * | 4/1993 | Hsu | 204/258 |
| 5,204,517 A | * | 4/1993 | Cates et al. | 134/1 |
| 5,211,985 A | * | 5/1993 | Shirley et al. | 427/213 |
| 5,212,496 A | * | 5/1993 | Badesha et al. | 347/45 |
| 5,328,517 A | * | 7/1994 | Cates et al. | 134/7 |
| 5,356,674 A | * | 10/1994 | Henne et al. | 427/449 |

(Continued)

FOREIGN PATENT DOCUMENTS

JP    05185596 A    *    7/1993

*Primary Examiner*—Stephen M. Gravini
(74) *Attorney, Agent, or Firm*—Oblon, Spivak, McClelland, Maier & Neustadt, L.L.P.

(57) ABSTRACT

A substrate processing method for a substrate processing system comprising at least a substrate processing apparatus that subjects a substrate to processing, and a substrate transferring apparatus having a transferring device that transfers the substrate, which enables the yield to be increased without bringing about a decrease in the throughput. The substrate processing method comprises a jetting step of jetting a high-temperature gas onto at least one of the transferring device and the substrate transferred by the transferring device.

10 Claims, 6 Drawing Sheets

U.S. PATENT DOCUMENTS

| | | | |
|---|---|---|---|
| 5,366,156 A * | 11/1994 | Bauer et al. | 239/135 |
| 5,400,603 A * | 3/1995 | Bauer et al. | 62/51.1 |
| 5,502,476 A * | 3/1996 | Neal et al. | 347/103 |
| 5,518,542 A * | 5/1996 | Matsukawa et al. | 118/52 |
| 5,527,389 A * | 6/1996 | Rosenblum et al. | 118/58 |
| 5,548,907 A * | 8/1996 | Gourdine | 34/448 |
| 5,621,022 A * | 4/1997 | Jaeger et al. | 523/161 |
| 5,627,578 A * | 5/1997 | Weintraub | 347/101 |
| 5,652,044 A * | 7/1997 | Rickerby | 428/216 |
| 5,653,045 A * | 8/1997 | Ferrell | 34/341 |
| 5,656,096 A * | 8/1997 | Van Alstyne | 134/1 |
| 5,660,047 A * | 8/1997 | Paganessi | 62/64 |
| 5,678,752 A * | 10/1997 | Kaminsky et al. | 228/223 |
| 5,720,818 A * | 2/1998 | Donde et al. | 118/500 |
| 5,782,253 A * | 7/1998 | Cates et al. | 134/105 |
| 5,789,755 A * | 8/1998 | Bender | 250/492.1 |
| 5,846,338 A * | 12/1998 | Bonora et al. | 134/11 |
| 5,902,841 A * | 5/1999 | Jaeger et al. | 523/161 |
| 5,914,091 A * | 6/1999 | Holst et al. | 422/173 |
| 5,964,954 A * | 10/1999 | Matsukawa et al. | 134/6 |
| 5,983,906 A * | 11/1999 | Zhao et al. | 134/1.1 |
| 6,027,766 A * | 2/2000 | Greenberg et al. | 427/226 |
| 6,028,316 A * | 2/2000 | Bender | 250/492.1 |
| 6,073,366 A * | 6/2000 | Aswad | 34/367 |
| 6,108,189 A * | 8/2000 | Weldon et al. | 361/234 |
| 6,165,555 A * | 12/2000 | Jun et al. | 427/252 |
| 6,183,558 B1 * | 2/2001 | Otake et al. | 118/65 |
| 6,195,505 B1 * | 2/2001 | Van Alstyne | 392/419 |
| 6,203,617 B1 * | 3/2001 | Tanoue et al. | 118/695 |
| 6,207,005 B1 * | 3/2001 | Henley et al. | 156/345.32 |
| 6,248,399 B1 * | 6/2001 | Hehmann | 427/248.1 |
| 6,249,132 B1 * | 6/2001 | Amemiya | 324/760 |
| 6,284,055 B1 * | 9/2001 | Dryer et al. | 134/10 |
| 6,290,804 B1 * | 9/2001 | Henley et al. | 156/345.32 |
| 6,322,626 B1 * | 11/2001 | Shirley | 118/73 |
| 6,327,994 B1 * | 12/2001 | Labrador | 114/382 |
| 6,344,084 B1 * | 2/2002 | Koinuma et al. | 117/201 |
| 6,362,044 B1 * | 3/2002 | Shimizu et al. | 438/255 |
| 6,408,537 B1 * | 6/2002 | Aswad | 34/380 |
| 6,432,824 B2 * | 8/2002 | Yanagisawa | 438/691 |
| 6,451,118 B1 * | 9/2002 | Garriga | 118/715 |
| 6,464,789 B1 * | 10/2002 | Akimoto | 118/666 |
| 6,474,986 B2 * | 11/2002 | Oda et al. | 432/247 |
| 6,492,309 B1 * | 12/2002 | Behr et al. | 510/175 |
| 6,578,287 B2 * | 6/2003 | Aswad | 34/367 |
| 6,589,889 B2 * | 7/2003 | Endisch et al. | 438/780 |
| 6,598,314 B1 * | 7/2003 | Kuo et al. | 34/265 |
| 6,613,678 B1 * | 9/2003 | Sakaguchi et al. | 438/695 |
| 6,677,167 B2 * | 1/2004 | Kanno et al. | 438/14 |
| 6,690,004 B2 * | 2/2004 | Miller et al. | 250/286 |
| 6,721,162 B2 * | 4/2004 | Weldon et al. | 361/234 |
| 6,797,607 B2 * | 9/2004 | Endisch et al. | 438/623 |
| 6,821,501 B2 * | 11/2004 | Matzakos et al. | 423/652 |
| 6,821,819 B1 * | 11/2004 | Benavides et al. | 438/122 |
| 6,827,435 B2 * | 12/2004 | Domoto et al. | 347/102 |
| 6,881,687 B1 * | 4/2005 | Castrucci | 438/795 |
| 6,936,134 B2 * | 8/2005 | Yonemizu et al. | 156/345.32 |
| 6,938,815 B2 * | 9/2005 | Li | 228/56.3 |
| 6,949,389 B2 * | 9/2005 | Pichler et al. | 438/26 |
| 6,949,403 B2 * | 9/2005 | Xiao et al. | 438/99 |
| 7,122,095 B2 * | 10/2006 | Letertre et al. | 156/344 |
| 7,138,016 B2 * | 11/2006 | Reardon et al. | 118/313 |
| 7,220,365 B2 * | 5/2007 | Qu et al. | 252/70 |
| 7,267,725 B2 * | 9/2007 | Kawano | 118/719 |
| 7,293,570 B2 * | 11/2007 | Jackson | 134/94.1 |
| 7,402,277 B2 * | 7/2008 | Ayer et al. | 419/2 |
| 7,404,870 B2 * | 7/2008 | Letertre et al. | 156/257 |
| 7,413,611 B2 * | 8/2008 | Iizuka | 118/726 |
| 2001/0015737 A1 * | 8/2001 | Truninger et al. | 347/47 |
| 2002/0056519 A1 * | 5/2002 | Henley et al. | 156/344 |
| 2003/0183306 A1 * | 10/2003 | Hehmann et al. | 148/404 |
| 2004/0003828 A1 * | 1/2004 | Jackson | 134/1 |
| 2004/0182416 A1 * | 9/2004 | Allen et al. | 134/1.3 |
| 2004/0206444 A1 * | 10/2004 | Letertre et al. | 156/182 |
| 2005/0016462 A1 * | 1/2005 | Yamazaki | 118/726 |
| 2006/0124156 A1 * | 6/2006 | Jackson | 134/99.1 |
| 2006/0231203 A1 * | 10/2006 | Letertre et al. | 156/344 |
| 2006/0233965 A1 * | 10/2006 | Boulos et al. | 427/446 |
| 2006/0278254 A1 * | 12/2006 | Jackson | 134/21 |
| 2007/0193062 A1 * | 8/2007 | Moriya et al. | 34/499 |
| 2008/0047585 A1 * | 2/2008 | Moriya | 134/6 |
| 2008/0181750 A1 * | 7/2008 | Moriya et al. | 414/217.1 |
| 2008/0223399 A1 * | 9/2008 | Onishi | 134/1.3 |
| 2008/0223400 A1 * | 9/2008 | Onishi et al. | 134/2 |
| 2008/0236629 A1 * | 10/2008 | Sugawara et al. | 134/22.11 |
| 2008/0236634 A1 * | 10/2008 | Moriya et al. | 134/95.3 |
| 2008/0245390 A1 * | 10/2008 | Freer et al. | 134/1.3 |
| 2009/0056741 A1 * | 3/2009 | Iida et al. | 134/1 |

* cited by examiner

SUBSTRATE PROCESSING SYSTEM, SUBSTRATE PROCESSING METHOD, AND STORAGE MEDIUM

BACKGROUND OF THE INVENTION

1. Field of the Invention

The present invention relates to a substrate processing system, a substrate processing method, and a storage medium.

2. Description of the Related Art

In a process of manufacturing a semiconductor device or an FPD (Flat Panel Display) such as a liquid crystal display from a substrate, there is a problem of preventing the substrate from being contaminated by particles that get in from outside the manufacturing apparatus or are produced in the manufacturing apparatus. In particular, if a stage provided in a reduced pressure processing chamber of the manufacturing apparatus is contaminated with particles, then the particles will become attached to a rear surface of the substrate mounted on the stage, so that the contamination escalates in subsequent processes, resulting in the yield of the semiconductor devices ultimately manufactured decreasing.

As such particles, one can envisage, for example, ones brought in from outside the reduced pressure processing chamber, ones formed by deposit being detached through contact between the stage and the substrate in the reduced pressure processing chamber, and deposit comprised of a product produced from a reactive gas.

Recently, the present applicants have thus proposed a method in which the temperature of the stage in the reduced pressure processing chamber is controlled, the temperature of the stage being made to be sufficiently higher or lower than a usual operating temperature, so that detachment of particles attached to the stage is induced through thermal stress, and furthermore have proposed a method in which the stage is held at a high temperature and a predetermined pressure is held so as to produce a thermophoretic force, whereby particles attached to the stage are scattered away from the stage (see, for example, Japanese Patent Application No. 2004-218939).

However, the substrate is not only contaminated by particles produced in the reduced pressure processing chamber, for example, particles attached to the stage on which the substrate is mounted, but rather is also contaminated during a transferring process of transferring the substrate. This arises in particular through transfer of particles attached to a transfer arm that transfers the substrate. To remove the particles attached to the transfer arm, operation of the transfer arm, and hence of a transfer chamber must be stopped; in particular, to stop the operation of a transfer chamber to which a plurality of processing chambers are connected, operation of all of the processing chambers must be stopped, and hence the throughput decreases markedly.

SUMMARY OF THE INVENTION

It is an object of the present invention to provide a substrate processing system, a substrate processing method, and a storage medium, that enable the yield to be increased without bringing about a decrease in the throughput.

To attain the above object, in a first aspect of the present invention, there is provided a substrate processing method for a substrate processing system comprising at least a substrate processing apparatus that subjects a substrate to processing, and a substrate transferring apparatus having a transferring device that transfers the substrate, the substrate processing method comprising a jetting step of jetting a high-temperature gas onto at least one of the transferring device and the substrate transferred by the transferring device.

According to the present aspect, the high-temperature gas is jetted onto the transferring means. As a result, particles attached to the transferring means are scattered away, and hence contamination of the transferring means can be prevented, and thus contamination can be prevented from being scattered onto the substrate transferred by the transferring means. Alternatively, the high-temperature gas is jetted onto the substrate transferred by the transferring means. As a result, particles attached to the substrate are scattered away, and hence contamination of the substrate can be prevented. Contamination of the substrate transferred by the substrate transferring apparatus can thus be prevented without stopping operation of the substrate transferring apparatus, and hence the yield can be increased without bringing about a decrease in the throughput.

Preferably, the jetting step comprises jetting the high-temperature gas onto the transferring device before the substrate is transferred by the transferring device.

According to the present aspect, the high-temperature gas is jetted onto the transferring means before the substrate is transferred by the transferring means. As a result, contamination of the substrate transferred by the transferring means can be prevented reliably.

Preferably, the high-temperature gas produces thermal stress on foreign matter attached to the at least one of the transferring device and the substrate transferred by the transferring device.

According to the present aspect, thermal stress is produced on foreign matter attached to at least one of the transferring means and the substrate transferred by the transferring means. As a result, the foreign matter can be scattered away by the thermal stress, and hence contamination of the transferring means and the substrate transferred by the transferring means can be prevented.

Preferably, the transferring device has a contacting portion that contacts the substrate, and the jetting step comprises jetting the high-temperature gas toward the contacting portion.

According to the present aspect, the high-temperature gas is jetted toward the contacting portion of the transferring means that contacts the substrate. As a result, foreign matter produced through the contact between the substrate and the contacting portion can be scattered away, and hence contamination of the transferring means can be prevented reliably.

Preferably, the jetting step comprises jetting the high-temperature gas onto the substrate before the substrate is transferred into the substrate processing apparatus by the transferring device.

According to the present aspect, the high-temperature gas is jetted onto the substrate before the substrate is transferred into the substrate processing apparatus by the transferring means. As a result, the temperature of the substrate can be increased in advance to a temperature reached in the substrate processing apparatus, and hence the state of temperature increase in the substrate processing apparatus can be made to be the same for all substrates. The processing results can thus be made to be uniform for all of the substrates, and hence the yield can be increased.

Preferably, moisture is attached to a surface of the substrate, and the jetting step comprises jetting the high-temperature gas toward the surface of the substrate.

According to the present aspect, the high-temperature gas is jetted toward a surface of the substrate to which moisture is attached. As a result, the moisture attached to the surface of the substrate can be evaporated off, and hence contamination of the substrate can be prevented.

Preferably, the substrate processing apparatus has a processing chamber in which the substrate is housed, and the jetting step comprises jetting the high-temperature gas into the processing chamber.

According to the present aspect, the high-temperature gas is jetted into the processing chamber of the substrate processing apparatus in which the substrate is housed. As a result, outgassing of moisture attached inside the processing chamber can be promoted, and hence the throughput can be improved.

Preferably, the substrate processing apparatus has a processing chamber in which the substrate is housed, adsorbed molecules are attached to a surface of the substrate, and the jetting step comprises jetting the high-temperature gas toward the surface of the substrate housed in the processing chamber.

According to the present aspect, the high-temperature gas is jetted toward the surface of the substrate housed in the processing chamber of the substrate processing apparatus, the surface of the substrate having adsorbed molecules attached thereto. As a result, the adsorbed molecules attached to the surface of the substrate can be scattered away inside the processing chamber, and hence corrosion due to scattering away of the adsorbed molecules outside the processing chamber can be prevented, and thus corrosion of the system can be prevented.

To attain the above object, in a second aspect of the present invention, there is provided a substrate processing system comprising at least a substrate processing apparatus that subjects a substrate to processing, and a substrate transferring apparatus having a transferring device for transferring the substrate, wherein the substrate transferring apparatus has a jetting device that jets a high-temperature gas onto at least one of the transferring device and the substrate transferred by the transferring device.

To attain the above object, in a third aspect of the present invention, there is provided a computer-readable storage medium storing a program for causing a computer to implement a substrate processing method for a substrate processing system comprising at least a substrate processing apparatus that subjects a substrate to processing, and a substrate transferring apparatus having a transferring device for transferring the substrate, the program comprising a jetting module for jetting a high-temperature gas onto at least one of the transferring device and the substrate transferred by the transferring device.

The above and other objects, features, and advantages of the invention will become more apparent from the following detailed description taken in conjunction with the accompanying drawings.

DETAILED DESCRIPTION OF THE PREFERRED EMBODIMENTS

Embodiments of the present invention will be described in detail below with reference to the drawings.

Figure 1:
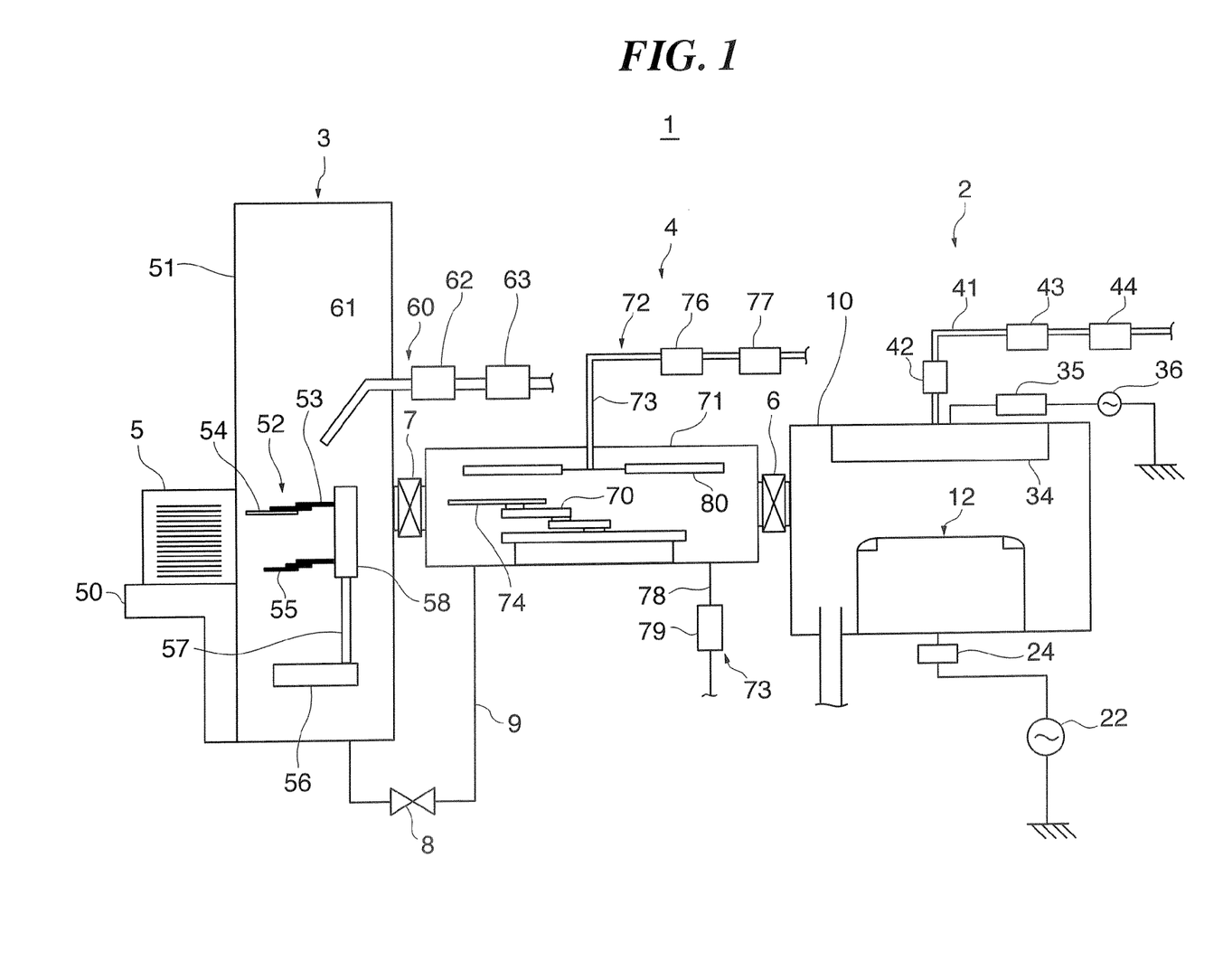
FIG. 1 is a sectional view schematically showing the construction of a substrate processing system according to a first embodiment of the present invention.

FIG. 1 is a sectional view schematically showing the construction of a substrate processing system according to a first embodiment of the present invention.

As shown in FIG. 1, the substrate processing system 1 is comprised of a substrate processing apparatus (Process Module) (hereinafter referred to as "P/M") 2 shown in FIG. 2, described below, which subjects semiconductor wafers (hereinafter referred to merely as "wafers") W as substrates to plasma processing such as RIE (Reactive Ion Etching) or ashing, an atmospheric transfer apparatus 3 that removes each wafer W from a FOUP (Front Opening Unified Pod) 5 as a container housing the wafers W, and a load-lock module (hereinafter referred to as "LL/M") 4 that is disposed between the atmospheric transfer apparatus 3 and the P/M 2, and is for transferring each wafer W from the atmospheric transfer apparatus 3 into the P/M 2 and from the P/M 2 into the atmospheric transfer apparatus 3.

Each of the P/M 2 and the LL/M 4 is constructed such that the interior thereof can be evacuated, while the interior of the atmospheric transfer apparatus 3 is always held at atmospheric pressure. Moreover, the P/M 2 and the LL/M 4, and the LL/M 4 and the atmospheric transfer apparatus 3, are connected together via gate valves 6 and 7 respectively. Each of the gate valves 6 and 7 can be opened and closed, so that the P/M 2 and the LL/M 4, and the LL/M 4 and the atmospheric transfer apparatus 3, can be communicated with one another or shut off from one another. Moreover, the interior of the LL/M 4 and the interior of the atmospheric transfer apparatus 3 are connected together via a communicating pipe 9 having an openable/closable valve 8 disposed part way therealong.

The atmospheric transfer apparatus 3 has a FOUP mounting stage 50 on which the FOUP 5 is mounted, an atmospheric loader module (hereinafter referred to as "L/M") 51, and a gas supply system 60 (jetting device) that supplies a high-temperature gas into the L/M 51.

The FOUP mounting stage 50 is a stage having a flat upper surface. The FOUP 5 houses, for example, 25 wafers W, which are mounted in a plurality of tiers at equal pitch. The L/M 51 has a rectangular parallelepiped box shape, and has therein a SCARA-type transfer arm 52 for transferring the wafers W.

A shutter (not shown) is provided in a side of the L/M 51 on the FOUP mounting stage 50 side facing the FOUP 5 mounted on the FOUP mounting stage 50. The FOUP 5 and the interior of the L/M 51 are communicated together when the shutter is opened.

The transfer arm 52 has an articulated transfer arm arm portion 53 which is constructed such as to be able to bend and extend, and a pick 54 shown in FIG. 3A, described below, which is attached to a distal end of the transfer arm arm portion 53. The pick 54 is constructed such that a wafer W is mounted directly thereon. Moreover, the transfer arm 52 has an articulated mapping arm 55 which is constructed such as to be able to bend and extend, a mapping sensor (not shown) that, for example, emits a laser beam so as to verify whether or not a wafer W is present being disposed at a distal end of the mapping arm 55. A base end of each of the transfer arm arm portion 53 and the mapping arm 55 is linked to a rising/falling stage 58 that rises/falls along an arm base end supporting pillar 57 that is provided standing upright from a base 56 of the transfer arm 52. Moreover, the arm base end supporting pillar 57 is constructed such as to be able to turn. In a mapping operation carried out for verifying the positions and number- of the wafers W housed in the FOUP 5, in a state with the mapping arm 55 extended, the mapping arm 55 rises and falls, and verifies the positions and number of the wafers W in the FOUP 5.

The transfer arm 52 can freely bend via the transfer arm arm portion 53, and can freely turn via the arm base end supporting pillar 57, and hence a wafer W mounted on the pick 54 can be freely transferred between the FOUP 5 and the LL/M 4.

The gas supply system 60 has a gas introducing pipe 61 that penetrates through from outside the L/M 51 to inside the L/M 51 and is provided such that the end thereof inside the L/M 51 faces the transfer arm 52, a gas supply apparatus (not shown) that is connected to an end of the gas introducing pipe 61 on the outside of the L/M 51, a control valve 63 that is disposed in the gas introducing pipe 61 between the L/M 51 and the gas supply apparatus, and a heating unit 62 that is disposed in the gas introducing pipe 61 between the L/M 51 and the control valve 63. In the present embodiment, the heating unit 62 preferably increases the temperature of supplied gas to a predetermined high temperature through heating over a short period of approximately 1 to 10 seconds.

In the present embodiment, the gas supply system 60 sprays a high-temperature gas heated by the heating unit 62 onto the transfer arm 52, in particular the pick 54, with a predetermined timing, thus removing particles attached to the transfer arm 52. The details of the particle removal will be described later.

The LL/M 4 has a chamber 71 in which is disposed a transfer arm 70 that can bend, extend and turn, a gas supply system 72 (jetting means) that supplies an inert gas such as $N_2$ gas at a high temperature into the chamber 71, and an LL/M exhaust system 73 that exhausts the interior of the chamber 71.

The transfer arm 70 is a SCARA-type transfer arm comprising a plurality of arm portions, and has a pick 74 attached to a distal end thereof. The pick 74 is constructed such that a wafer W is mounted directly thereon. The shape of the pick 74 is like that of the pick 54.

When a wafer W is to be transferred from the atmospheric transfer apparatus 3 into the P/M 2, once the gate valve 7 has been opened, the transfer arm 70 receives the wafer W from the transfer arm 52 in the L/M 51, and once the gate valve 6 has been opened, the transfer arm 70 enters into a chamber 10 of the P/M 2, and mounts the wafer W on upper ends of pusher pins 33, described below, which project out from an upper surface of a stage 12. Moreover, when the wafer W is to be transferred from the P/M 2 into the atmospheric transfer apparatus 3, once the gate valve 6 has been opened, the transfer arm 70 enters into the chamber 10 of the P/M 2 and receives the wafer W mounted on the upper ends of the pusher pins 33 projecting out from the upper surface of the stage 12, and once the gate valve 7 has been opened, the transfer arm 70 passes the wafer W to the transfer arm 52 in the L/M 51.

Note that the transfer arm 70 is not limited to being of a SCARA type, but rather may instead be of a frog leg type or a double arm type.

The gas supply system 72 has a gas introducing pipe 75 that penetrates through from outside the chamber 71 to inside the chamber 71, a gas supply apparatus (not shown) that is connected to an end of the gas introducing pipe 75 on the outside of the chamber 71, a control valve 77 that is disposed in the gas introducing pipe 75 between the chamber 71 and the gas supply apparatus, a heating unit 76 that is disposed in the gas introducing pipe 75 between the chamber 71 and the control valve 77, and a gas supply port that is disposed at an end of the gas introducing pipe 75 on the inside of the chamber 71 and jets out an inert gas such as $N_2$ gas at a high temperature. In the present embodiment, there may be a pair of break filters 80 at an end of the gas supply port. In the present embodiment, the heating unit 76 preferably increases the temperature of the supplied inert gas such as $N_2$ gas to a predetermined high temperature through heating over a short period of approximately 1 to 10 seconds.

In the present embodiment, the gas supply system 72 sprays the high-temperature inert gas such as $N_2$ gas heated by the heating unit 76 onto the transfer arm 70, in particular the pick 74, in the chamber 71 with a predetermined timing, thus removing particles attached to the transfer arm 70. The details of the particle removal will be described later. Moreover, the gas supply system 72 supplies the high-temperature inert gas such as $N_2$ gas into the chamber 71 with a predetermined timing, so as to control the pressure inside the chamber 71.

Each of the break filters 80 is a mesh-like metal filter having a length thereof set to, for example, 200 mm, and is able to reduce or increase the area over which the high-temperature inert gas such as $N_2$ gas is jetted; the flow of the jetted high-temperature inert gas such as $N_2$ gas can thus be accelerated or decelerated, and hence the high-temperature inert gas such as $N_2$ gas can be jetted at a high pressure onto the transfer arm 70, so as to remove particles attached to the transfer arm 70 effectively, or the high-temperature inert gas such as $N_2$ gas can be jetted uniformly over a broad area, so as to increase the pressure in the chamber 71 uniformly.

The L/LM exhaust system 73 has an exhaust pipe 78 that penetrates through into the chamber 71, and a control valve 79 that is disposed part way along the exhaust pipe 78; the L/LM exhaust system 73 operates in collaboration with the gas supply system 72 described above to control the pressure in the chamber 71.

Figure 2:
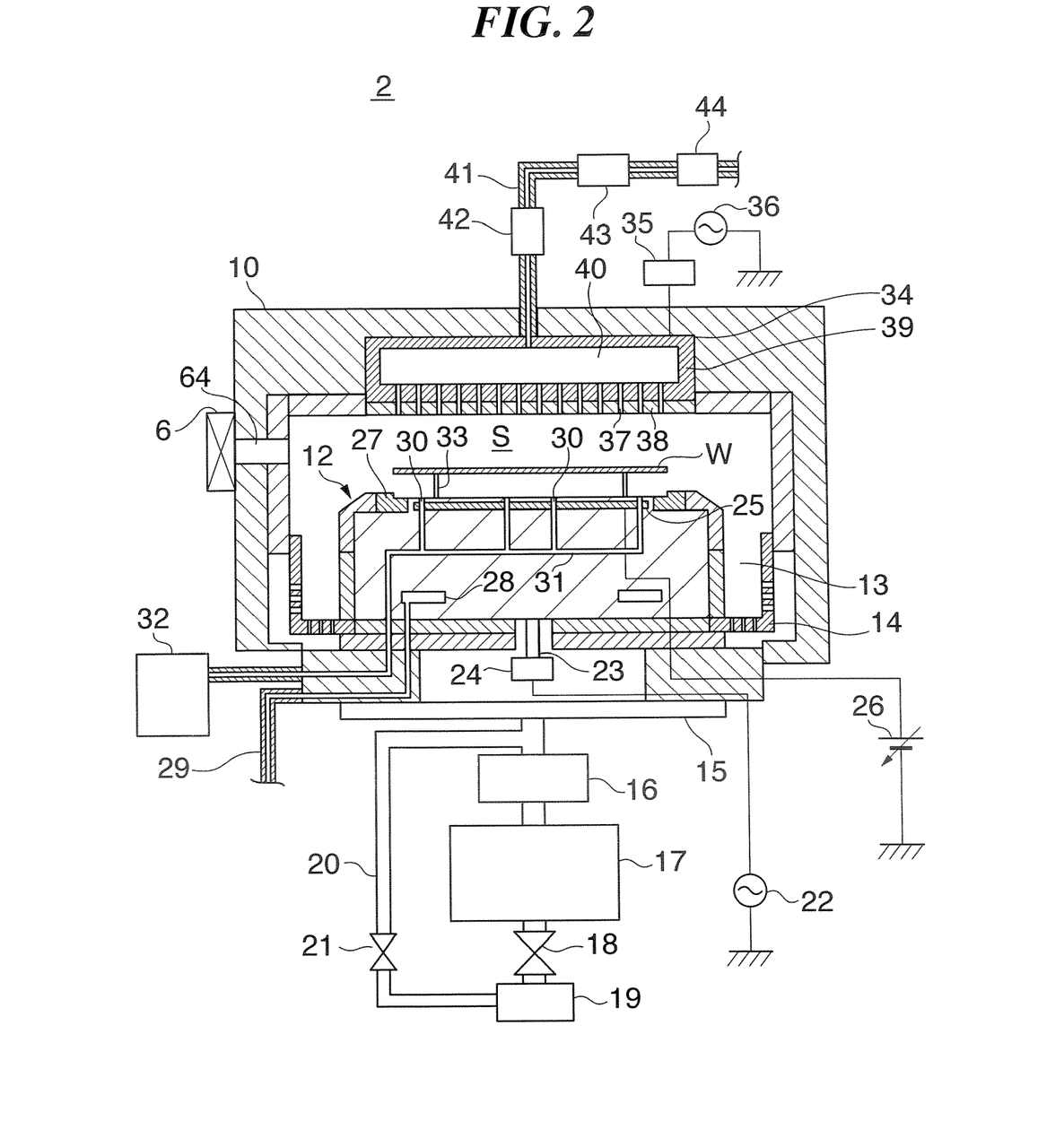
FIG. 2 is a sectional view schematically showing the construction of a P/M appearing in FIG. 1.

FIG. 2 is a sectional view schematically showing the construction of the P/M 2 appearing in FIG. 1.

As shown in FIG. 2, the P/M 2 has a cylindrical chamber 10 made of aluminum having an inside wall thereof coated with alumite. A cylindrical stage 12 on which is mounted a wafer W having a diameter of, for example, 300 mm is disposed in the chamber 10.

In the P/M 2, an exhaust path 13 that acts as a flow path through which gas molecules above the stage 12 are discharged to the outside of the chamber 10 is formed between the inside wall of the chamber 10 and a side face of the stage 12. An annular exhaust plate 14 that prevents leakage of plasma is disposed part way along the exhaust path 13. A space in the exhaust path 13 downstream of the exhaust plate 14 bends round below the stage 12, and is communicated with an automatic pressure control valve (APC valve) 15, which is a variable butterfly valve. The APC valve 15 is connected to a turbo-molecular pump (TMP) 17, which is an exhausting pump for evacuation, via an isolator valve 16, and the TMP 17 is connected to a dry pump (DP) 19, which is also an exhausting pump, via a valve 18. The exhaust flow path (main exhaust line) comprised of the APC valve 15, the isolator valve 16, the TMP 17, the valve 18 and the DP 19 is used for controlling the pressure in the chamber 10 using the APC valve 15, and also for reducing the pressure in the chamber 10 down to a substantially vacuum state using the TMP 17 and the DP 19.

Moreover, piping 20 is connected from between the APC valve 15 and the isolator valve 16 to the DP 19 via a valve 21. The exhaust flow path (bypass line) comprised of the piping 20 and the valve 21 bypasses the TMP 17, and is used for roughing the chamber 10 using the DP 19.

A lower electrode radio frequency power source 22 is connected to the stage 12 via a feeder rod 23 and a matcher 24. The lower electrode radio frequency power source 22 supplies predetermined radio frequency electrical power to the stage 12. The stage 12 thus acts as a lower electrode. The matcher 24 reduces reflection of the radio frequency electrical power from the stage 12 so as to maximize the efficiency of the supply of the radio frequency electrical power into the stage 12.

A disk-shaped ESC electrode plate 25 comprised of an electrically conductive film is provided in an upper portion of the stage 12. A DC power source 26 is electrically connected to the ESC electrode plate 25. A wafer W is attracted to and held on an upper surface of the stage 12 through a Johnsen-Rahbek force or a Coulomb force generated by a DC voltage applied to the ESC electrode plate 25 from the DC power source 26. Moreover, an annular focus ring 27 is provided on the upper portion of the stage 12 so as to surround the wafer W attracted to and held on the upper surface of the stage 12. The focus ring 27 is made of silicon, SiC (silicon carbide), or Qz (quartz), is exposed to a processing space S, described below, and focuses plasma in the processing space S toward a front surface of the wafer W, thus improving the efficiency of the plasma processing.

An annular coolant chamber 28 that extends, for example, in a circumferential direction of the stage 12 is provided inside the stage 12. A coolant, for example cooling water or a Galden (registered trademark) fluid, at a predetermined temperature is circulated through the coolant chamber 28 via coolant piping 29 from a chiller unit (not shown). A temperature of the stage 12, and hence of the wafer W attracted to and held on the upper surface of the stage 12, is controlled through the temperature of the coolant.

A plurality of heat-transmitting gas supply holes 30 are provided in a portion of the upper surface of the stage 12 on which the wafer W is attracted and held (hereinafter referred to as the "attracting surface") facing the wafer W. The heat-transmitting gas supply holes 30 are connected to a heat-transmitting gas supply unit 32 by a heat-transmitting gas supply line 31 provided inside the stage 12. The heat-transmitting gas supply unit 32 supplies helium (He) gas as a heat-transmitting gas via the heat-transmitting gas supply holes 30 into a gap between the attracting surface of the stage 12 and a rear surface of the wafer W. The heat-transmitting gas supply holes 30, the heat-transmitting gas supply line 31, and the heat-transmitting gas supply unit 32 together constitute a heat-transmitting gas supply apparatus. Note that the type of the backside gas is not limited to being helium, but rather may also be an inert gas such as nitrogen ($N_2$), argon (Ar), krypton (Kr) or xenon (Xe), or oxygen ($O_2$) or the like instead.

Three pusher pins 33 are provided in the attracting surface of the stage 12 as lifting pins that can be made to project out from the upper surface of the stage 12. The pusher pins 33 are connected to a motor (not shown) by a ball screw (not shown), and can be made to project out from the attracting surface of the stage 12 through rotational motion of the motor, which is converted into linear motion by the ball screw. The pusher pins 33 are housed inside the stage 12 when a wafer W is being attracted to and held on the attracting surface of the stage 12 so that the wafer W can be subjected to the plasma processing, and are made to project out from the upper surface of the stage 12 so as to lift the wafer W up away from the stage 12 when the wafer W is to be transferred out from the chamber 10 after having been subjected to the plasma processing.

A gas introducing shower head 34 (jetting means) is disposed in a ceiling portion of the chamber 10 facing the stage 12. An upper electrode radio frequency power source 36 is connected to the gas introducing shower head 34 via a matcher 35. The upper electrode radio frequency power source 36 supplies predetermined radio frequency electrical power to the gas introducing shower head 34. The gas introducing shower head 34 thus acts as an upper electrode. The matcher 35 has a similar function to the matcher 24, described earlier.

The gas introducing shower head 34 has a ceiling electrode plate 38 having a large number of gas holes 37 therein, and an electrode support 39 on which the ceiling electrode plate 38 is detachably supported. A buffer chamber 40 is provided inside the electrode support 39. A gas introducing pipe 41 is connected from a gas supply apparatus (not shown) to the buffer chamber 40. A piping insulator 42 is disposed in the gas introducing pipe 41 between the gas supply apparatus and the chamber 10. The piping insulator 42 is made of an electrically insulating material, and prevents the radio frequency electrical power supplied to the gas introducing shower head 34 from leaking into the gas supply apparatus via the gas introducing pipe 41. Moreover, a control valve 44 is disposed in the gas introducing pipe 41 between the gas supply apparatus and the piping insulator 42, and a heating unit 43 is disposed in the gas introducing pipe 41 between the piping insulator 42 and the control valve 44. In the present embodiment, the heating unit 43 preferably increases the temperature of a supplied processing gas to a predetermined high temperature through heating over a short period of approximately 1 to 10 seconds.

In the present embodiment, the high-temperature processing gas supplied from the gas introducing pipe 41 into the buffer chamber 40 is supplied by the gas introducing shower head 34 into the chamber 10 via the gas holes 37.

A transfer port 64 for the wafers W is provided in a side wall of the chamber 10 in a position at the height of a wafer W that has been lifted up from the stage 12 by the pusher pins 33. The gate valve 6 is provided in the transfer port 44 for opening and closing the transfer port 44.

Upon supplying radio frequency electrical power to the stage 12 and the gas introducing shower head 34 in the chamber 10 of the P/M 2 as described above, and thus applying radio frequency electrical power into the processing space S between the stage 12 and the gas introducing shower head 34, high-density plasma is produced from the processing gas supplied from the gas introducing shower head 34 into the processing space S; the wafer W is subjected to the plasma processing by the plasma.

Specifically, when subjecting a wafer W to the plasma processing in the P/M 2, first, the gate valve 6 is opened, and the wafer W to be processed is transferred into the chamber 10, and attracted to and held on the attracting surface of the stage 12 by applying a DC voltage to the ESC electrode plate 25. Moreover, the processing gas (e.g. a mixed gas comprised of $CF_4$ gas, $O_2$ gas, and Ar gas with a predetermined flow ratio therebetween) is supplied from the gas introducing shower head 34 into the chamber 10 at a predetermined flow rate and flow ratio, and the pressure inside the chamber 10 is controlled to a predetermined value using the APC valve 15. Furthermore, radio frequency electrical power is applied into the processing space S in the chamber 10 from the stage 12 and the gas introducing shower head 34. The processing gas introduced in from the gas introducing shower head 34 is thus turned into plasma in the processing space S. The plasma is focused onto the front surface of the wafer W by the focus ring 27, whereby the front surface of the wafer W is physically/ chemically etched.

Operation of the component elements of the P/M 2, the atmospheric transfer apparatus 3, and the LL/M 4 constituting the substrate processing system 1 shown in FIG. 1 is controlled in accordance with a program for implementing a substrate processing method according to the present embodiment by a computer (not shown) as a controller of the substrate processing system 1, or by an external server (not shown) as a controller connected to the substrate processing system 1.

In the P/M 2 connected to the LL/M 4 of the substrate processing system 1 described above, the stage 12 acting as the lower electrode does not move relative to the gas introducing shower head 34; however, the P/M connected to the LL/M 4 is not limited to this, but rather may instead be, for example, one in which the lower electrode does move relative to (approaches) the gas introducing shower head 34.

Next, the substrate processing method according to the first embodiment of the present invention will be described. This substrate processing method is implemented in the atmospheric transfer apparatus 3 and the LL/M 4 of the substrate processing system 1.

First, the shape of the pick 54 of the transfer arm 52 in the atmospheric transfer apparatus 3 will be described with reference to FIGS. 3A and 3B. Note that, as described above, the shape of the pick 74 of the transfer arm 70 in the LL/M 4 is like that of the pick 54.

Figure 3A:
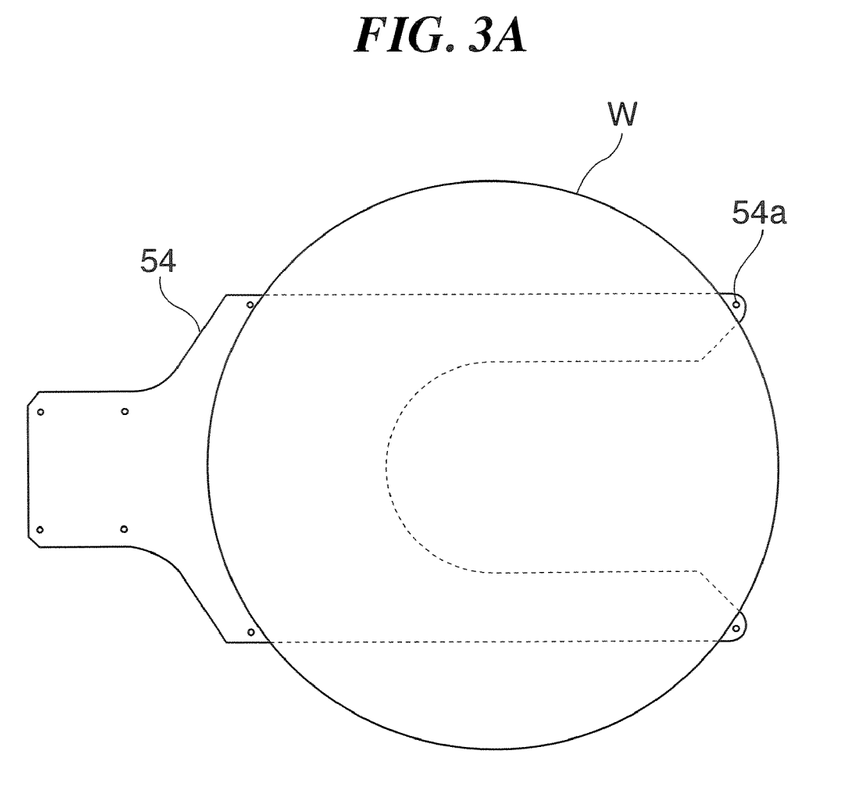
FIGS. 3A and 3B are views schematically showing the shape of a pick of a transfer arm in an L/M appearing in FIG. 1, FIG. 3A showing a plan view in a state with a wafer mounted on the pick, and FIG. 3B showing an enlarged perspective view of part of the pick around a tapered pad on the pick.
Figure 3B:
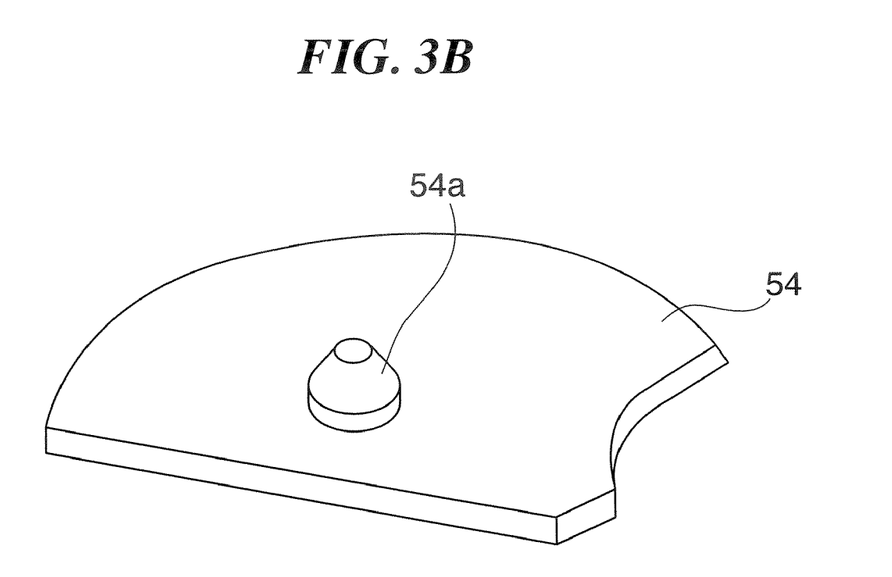

FIG. 3A shows a plan view in a state with a wafer W mounted on the pick 54, and FIG. 3B shows an enlarged perspective view of part of the pick 54 around a tapered pad 54a, described below, that is provided on the pick 54.

As shown in FIG. 3A, the pick 54 has a fork shape, and has thereon four tapered pads 54a that support the wafer W with the wafer W separated by a predetermined gap from a surface of the pick 54. As shown in FIG. 3B, each of the tapered pads 54a has a shape comprising a truncated conical member on a cylindrical member. The four tapered pads 54a are disposed on the pick 54 around an outer periphery (a beveled portion) of the wafer W, each of the tapered pads 54a having the truncated conical portion thereof in contact with the outer periphery of the wafer W so as to prevent slipping of the wafer W relative to the pick 54.

When a wafer W is transferred by the transfer arm 52 in the atmospheric transfer apparatus 3 or the transfer arm 70 in the LL/M 4, as described above, the outer periphery of the wafer W contacts the truncated conical portion of each of the tapered pads, and hence particles become attached to the pick, in particular the tapered pads. It is thought that the attached particles are produced through wear of the tapered pads through contact friction between the outer periphery of the wafer W and the tapered pads, or through detachment of CF-type polymer attached to the outer periphery of the wafer W. When a wafer W is transferred, the particles attached to the tapered pads are then scattered toward the wafer W, causing contamination of the wafer W.

In the present embodiment, in the atmospheric transfer apparatus 3, a high-temperature gas is sprayed onto the transfer arm 52 by the gas supply system 60, whereby particles attached to the transfer arm 52, in particular the tapered pads 54a of the pick 54, are scattered away using thermal stress and thus removed. Moreover, in the LL/M 4, high-temperature $N_2$ gas is sprayed onto the transfer arm 70 by the gas supply system 72, whereby particles attached to the transfer arm 70, in particular the tapered pads of the pick 74, are scattered away using thermal stress and thus removed. As a result, each wafer W can be transferred without being contaminated. This will now be described in detail with reference to the drawings.

Figure 4A:
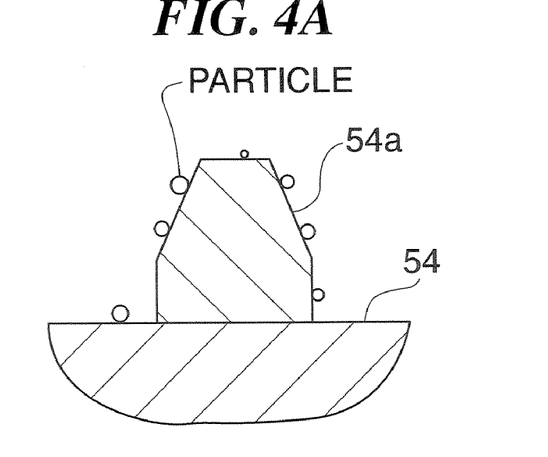
FIGS. 4A to 4C are process drawings showing a method of removing particles from the tapered pad using thermal stress.
Figure 4B:
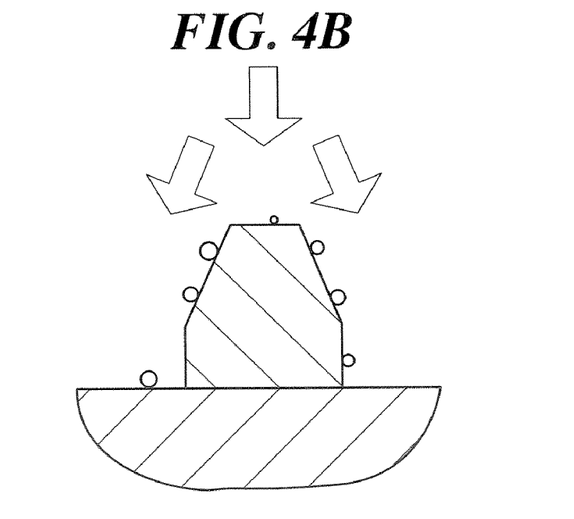
Figure 4C:
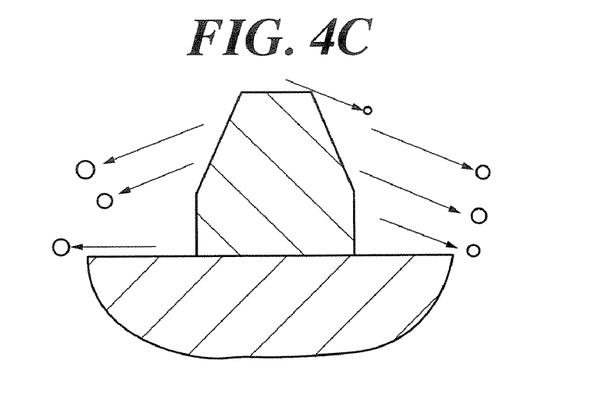

FIGS. 4A to 4C are process drawings showing a method of removing particles from each tapered pad 54a using thermal stress.

As shown in FIGS. 4A to 4C, in a state with particles attached to the pick 54 and each of the tapered pads 54a (FIG. 4A), the high-temperature gas (shown by white arrows) is sprayed onto the pick 54 and each of the tapered pads 54a (FIG. 4B), whereby the particles attached to the pick 54 and each of the tapered pads 54a are scattered away through thermal stress by the high-temperature gas (FIG. 4C). The particles attached to the pick 54 and each of the tapered pads 54a can thus be removed. The particles can also be removed through a similar technique for the pick 74 and the tapered pads thereon.

Conventionally, upon attempting to scatter away particles attached to, for example, a tapered pad by spraying with a gas, a layer where the flow velocity of the gas is zero (a boundary layer) has arisen on the surface of the tapered pad, and hence it has not been possible to spray the gas onto particles within the boundary layer, and thus it has not been possible to scatter away all of the particles. In contrast with this, in the present embodiment, the particles are scattered away using thermal stress from the high-temperature gas. Moreover, by varying the pressure of the sprayed gas, pulse waves can be produced, and hence the particles can be scattered away more effectively due to the pulse waves breaking through the above-described boundary layer. In other words, in the present embodiment, by spraying while varying the pressure of the high-temperature gas, the removal of the particles can be carried out more efficiently.

In the present embodiment, any gas maybe used as the high-temperature gas; oxygen gas, or a mixed gas of oxygen and other gas molecules, or ozone gas, at a high temperature may be used, so as to decompose fluorocarbon-type polymer, thus also promoting a chemical removal effect.

Conventionally, a wafer W is transferred into a P/M in a state with the temperature of the wafer W being low, and then plasma processing is carried out in the P/M, whereupon the wafer W is heated through heat input from the plasma, and hence the temperature of the wafer W changes. The heat input from the plasma is not stable but rather is different for each wafer W, and hence the state of temperature increase differs for each wafer W, and as a result the plasma processing results differ for each wafer W (process shift).

In contrast with this, in the present embodiment, the high-temperature gas is sprayed onto each wafer W in the transferring process to remove particles, and hence before the wafer W is subjected to the plasma processing, the temperature of the wafer W is increased in advance to the temperature reached through heat input from the plasma, and thus the above-described process shift can be prevented. In this case, wafer W temperature detecting means may be provided in the LL/M 4 and the atmospheric transfer apparatus 3 so that the temperature of the wafer W in the transferring process can be reliably controlled to the temperature reached through heat input from the plasma, and to shorten the heating time, the high-temperature gas may be sprayed in in the transferring process at a temperature close to the temperature reached through heat input from the plasma. Furthermore, the temperature of the wafer W may be increased to the temperature reached through heat input from the plasma by spraying in the processing gas at a high temperature from the gas introducing shower head 34 after the wafer W has been transferred into the chamber 10 of the P/M 2 but before subjecting the wafer W to the plasma processing.

Figure 5:
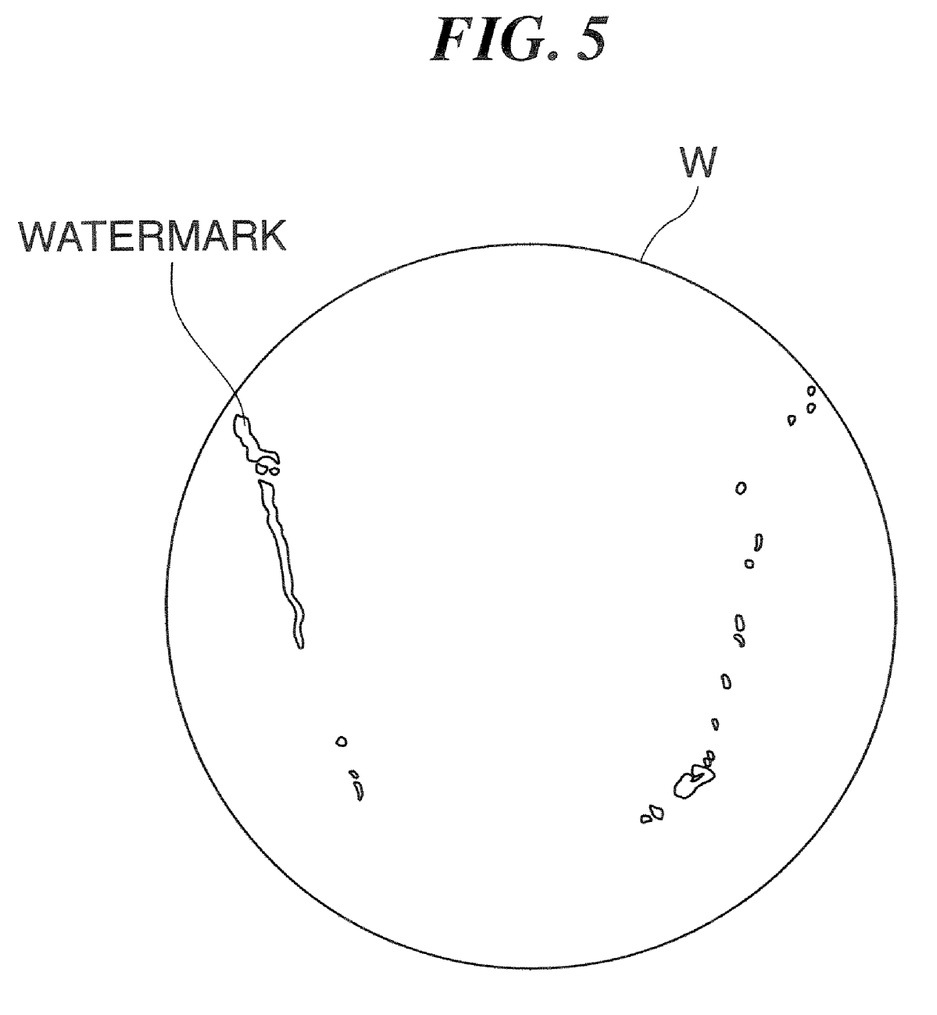
FIG. 5 is a view for explaining a watermark remaining on a wafer.

Moreover, conventionally, if a wafer W is transferred into the chamber 10 of the P/M 2 in a state with the temperature of the wafer W being low, and the chamber 10 is evacuated, then moisture adsorbed on the wafer W is deposited as vapor onto the wafer W through the evacuation, and hence watermarks remain on the wafer W as shown in FIG. 5. The more residual moisture on the wafer W, the more watermarks remain after the evacuation, such watermarks readily forming defects on the wafer W. Moreover, the shape of a watermark remaining on the wafer W varies depending on the overall apparatus construction of the substrate processing system. In the present embodiment, because the high-temperature gas is sprayed onto the wafer W in the transferring process, the temperature of the wafer W is increased before the wafer W is transferred into the chamber 10 of the P/M 2, whereby residual moisture on the wafer W can be removed, and hence watermarks can be prevented from remaining on the wafer W. Such watermarks can be removed by heating even in an atmosphere, but are more readily removed in a vacuum, and hence are preferably removed before the wafer W is transferred into the atmospheric transfer apparatus 3.

Moreover, conventionally, during evacuation after maintenance on a vacuum chamber (in which the vacuum chamber is released to the atmosphere), outgassing of moisture attached to an inside wall of the chamber and so on takes place as times passes, and hence the evacuation takes a long time. In the present embodiment, the high-temperature gas is supplied into the chamber (the chamber 71 or the chamber 10), and hence after maintenance on the chamber, outgassing of moisture attached to the inside wall of the chamber is promoted by the high-temperature gas being supplied in, and thus the evacuation can be carried out in a short period. For a chamber for which there is almost no or very little outgassing from inside the inside wall such as a pure aluminum chamber or a ceramic thermal spraying chamber, moisture attached to the inside wall of the chamber is the main cause of outgassing. If the above technique is used with such a chamber, then the shortening of the evacuation time is very effective. The method of supplying in the high-temperature gas may be any method, but if the high-temperature gas is supplied in while carrying out the evacuation, then the outgassing of the moisture can be promoted efficiently. Moreover, to increase the reactivity with the moisture, the pressure of the high-temperature gas may be varied, or a gas having high reactivity with moisture may be mixed into the high-temperature gas. Examples of gases having high reactivity with moisture include $HCl$, $BCl_3$, $NOCl$, $COCl_2$, $COF_2$, $B_2H_8$, $Cl_2$, $F_2$, $SOBr_2$, dichloropropane, dimethylpropane, dibromopropane, trimethyldichlorosilane dimethyldichlorosilane, monomethyltrichlorosilane, and tetrachlorosilane.

Next, a substrate processing method according to a second embodiment of the present invention will be described. This substrate processing method is implemented in the P/M 2 of the substrate processing system 1.

In the present embodiment, in the P/M 2, a high-temperature gas is sprayed onto the front surface of the wafer W by the gas introducing shower head 34, whereby particles attached to the front surface of the wafer W are scattered away using thermal stress. Moreover, a high temperature heat-transmitting gas may also be sprayed onto the rear surface of the wafer W by the heat-transmitting gas supply unit 32, whereby particles attached to the rear surface of the wafer W may be scattered away using thermal stress.

Conventionally, if a wafer W is transferred out from the chamber 10 of the P/M 2 in a state with corrosive adsorbed molecules attached to the wafer W after the plasma processing, then the substrate processing system 1 may be corroded by the adsorbed molecules evaporating off from the wafer W. In the present embodiment, the wafer W is heated by spraying the high-temperature gas toward the wafer W from the gas introducing shower head 34, which is positioned facing the front surface of the wafer W, after the plasma processing, so as to increase the temperature of the wafer W, whereby adsorbed molecules on the wafer W can be removed. Moreover, the wafer W may be heated by spraying the high-temperature heat-transmitting gas toward the wafer W from the heat-transmitting gas supply holes 30, which face the rear surface of the wafer W, after the plasma processing, so as to increase the temperature of the wafer W, whereby adsorbed molecules on the wafer W can be removed. This will now be described in detail with reference to the drawings.

Figure 6A:
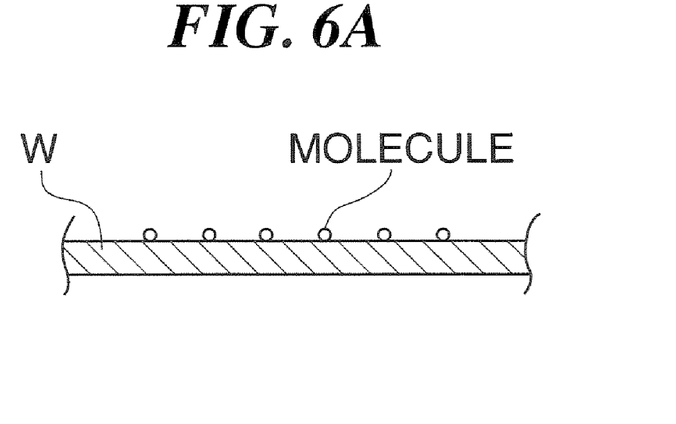
FIGS. 6A to 6C are process drawings showing a method of removing adsorbed molecules on a wafer using thermal stress.
Figure 6B:
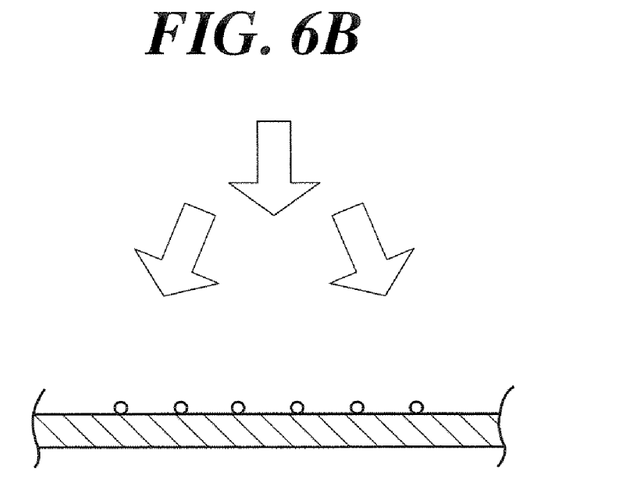
Figure 6C:
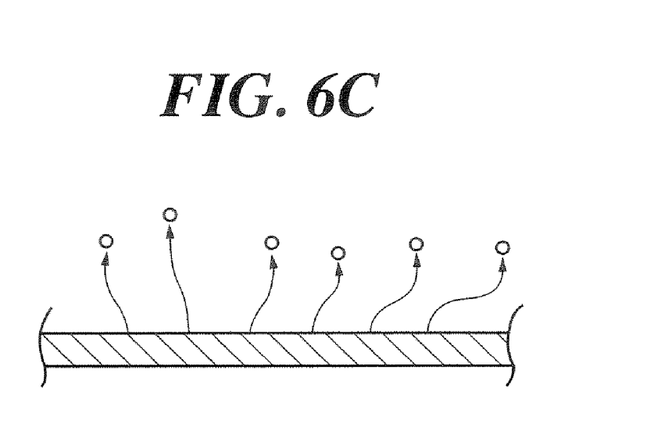

FIGS. 6A to 6C are process drawings showing a method of removing adsorbed molecules on a wafer W using thermal stress.

As shown in FIGS. 6A to 6C, in a state with adsorbed molecules attached to the front surface of the wafer W (FIG. 6A), the high-temperature gas (shown by white arrows) is sprayed onto the front surface of the wafer W (FIG. 6B), so as to increase the temperature of the wafer W, whereby the adsorbed molecules attached to the front surface of the wafer W are scattered away from the front surface of the wafer W through thermal stress (FIG. 6C). As a result, adsorbed molecules attached to the wafer W after the plasma processing can be removed. Adsorbed molecules attached to the rear surface of the wafer W can be similarly removed.

In the present embodiment, again, the removal of the adsorbed molecules can be carried out more efficiently by varying the pressure of the sprayed high-temperature gas so as to produce pulse waves.

As described earlier, if the plasma processing is carried out on the wafer W in the P/M 2 in a state with the temperature of the wafer W being low, then the plasma processing results differ for each wafer W. In contrast with this, in the present embodiment, the high-temperature gas is sprayed in from the gas introducing shower head 34 before the wafer W is subjected to the plasma processing in the chamber 10 of the P/M 2. As a result, the temperature of the wafer W can be increased in advance to a temperature reached through heat input from the plasma, and thus the above-described process shift can be prevented. Moreover, the high temperature heat-transmitting gas may be sprayed toward the wafer W from the heat-transmitting gas supply holes 30, which face the rear surface of the wafer W, before carrying out the plasma processing, and again, the process shift can be prevented as a result.

Moreover, according to the present embodiment, again, watermarks can be prevented from remaining on the wafer W, and furthermore outgassing of moisture attached to the inside wall of the chamber 10 can be promoted, and hence evacuation can be carried out in a short period.

It is to be understood that the object of the present invention may also be accomplished by supplying a system or apparatus with a storage medium in which is stored a program code of software that realizes the functions of an embodiment described above, and then causing a computer (or CPU, MPU, or the like) of the system or apparatus to read out and execute the program code stored in the storage medium.

In this case, the program code itself read out from the storage medium realizes the functions of the embodiment, and hence the program code and the storage medium in which the program code is stored constitute the present invention.

Examples of the storage medium for supplying the program code include a floppy (registered trademark) disk, a hard disk, a magnetic-optical disk, an optical disk such as a CD-ROM, a CD-R, a CD-RW, a DVD-ROM, a DVD-RAM, a DVD-RW or a DVD+RW, a magnetic tape, a nonvolatile memory card, and a ROM. Alternatively, the program code may be downloaded via a network.

Moreover, it is to be understood that the functions of the embodiment may be accomplished not only by executing a program code read out by a computer, but also by causing an OS (operating system) or the like which operates on the computer to perform a part or all of the actual operations based on instructions of the program code.

Furthermore, it is to be understood that the functions of the embodiment may also be accomplished by writing a program code read out from a storage medium into a memory provided on an expansion board inserted into a computer or in an expansion unit connected to the computer and then causing a CPU or the like provided on the expansion board or in the expansion unit to perform a part or all of the actual operations based on instructions of the program code.

The form of the program code may be an object code, a program code executed by an interpreter, script data supplied to an OS, or the like.

The above-described embodiments are merely exemplary of the present invention, and are not be construed to limit the scope of the present invention.

The scope of the present invention is defined by the scope of the appended claims, and is not limited to only the specific descriptions in this specification. Furthermore, all modifications and changes belonging to equivalents of the claims are considered to fall within the scope of the present invention.

What is claimed is:

1. A substrate processing method for a substrate processing system comprising at least a substrate processing apparatus that subjects a substrate to processing, and a substrate transferring apparatus having a transferring device that transfers the substrate, the substrate processing method comprising:
   a transferring step of transferring the substrate, which has not been processed by the substrate processing apparatus, by the transferring device; and
   in said transferring step, a jetting step of jetting a high-temperature gas onto at least one of the transferring device which is transferring the substrate and the substrate which is being transferred by the transferring device so as to scatter away foreign matter from the transferring device and/or the substrate being transferred by the transferring device using thermal stress produced on the foreign matter attached to the at least one of the transferring device and the substrate being transferred by the transferring device.

2. A substrate processing method as claimed in claim 1, wherein said jetting step comprises jetting the high-temperature gas onto the transferring device on which the substrate is not mounted before the substrate is transferred by the transferring device.

3. A substrate processing method as claimed in claim 1, wherein the transferring device has a contacting portion that contacts the substrate, and said jetting step comprises jetting the high-temperature gas toward the contacting portion.

4. A substrate processing method as claimed in claim 1, wherein said jetting step comprises jetting the high-temperature gas onto the substrate before the substrate is transferred into the substrate processing apparatus by the transferring device.

5. A substrate processing method as claimed in claim 1, wherein moisture is attached to a surface of the substrate, and said jetting step comprises jetting the high-temperature gas toward the surface of the substrate.

6. A substrate processing method as claimed in claim 1, wherein the substrate processing apparatus has a processing chamber in which the substrate is housed, and said jetting step comprises jetting the high-temperature gas into the processing chamber.

7. A substrate processing method as claimed in claim 1, wherein the substrate processing apparatus has a processing chamber in which the substrate is housed, adsorbed molecules are attached to a surface of the substrate, and said jetting step comprises jetting the high-temperature gas toward the surface of the substrate housed in the processing chamber.

8. A substrate processing system comprising at least a substrate processing apparatus that subjects a substrate to processing, and a substrate transferring apparatus having a transferring device for transferring the substrate, wherein:
   the transferring device transfers the substrate which has not been processed by the substrate processing apparatus, and
   said substrate transferring apparatus has a jetting device that jets a high-temperature gas onto at least one of the transferring device which is transferring the substrate and the substrate which is being transferred by the transferring device so as to scatter away foreign matter from the transferring device and/or the substrate being transferred by the transferring device using thermal stress produced on the foreign matter attached to the at least one of the transferring device and the substrate being transferred by the transferring device.

9. A computer-readable storage medium storing a program for causing a computer to implement a substrate processing method for a substrate processing system comprising at least a substrate processing apparatus that subjects a substrate to processing, and a substrate transferring apparatus having a transferring device for transferring the substrate, the substrate processing method comprising:
   a transferring step of transferring the substrate, which has not been processed by the substrate processing apparatus, by the transferring device; and
   in said transferring step, a jetting step of jetting a high-temperature gas onto at least one of the transferring device which is transferring the substrate and the substrate which is being transferred by the transferring device so as to scatter away foreign matter from the transferring device and/or the substrate being transferred by the transferring device using thermal stress produced on the foreign matter attached to the at least one of the transferring device and the substrate being transferred by the transferring device.

10. A substrate processing method as claimed in claim 1, wherein said jetting step jets the high-temperature gas while varying a pressure of the high-temperature gas.

* * * * *